(12) United States Patent
Cranford, Jr. et al.

(10) Patent No.: US 6,298,458 B1
(45) Date of Patent: Oct. 2, 2001

(54) SYSTEM AND METHOD FOR MANUFACTURING TEST OF A PHYSICAL LAYER TRANSCEIVER

(75) Inventors: Hayden C. Cranford, Jr., Apex, NC (US); Eirik Gude, Burlington; Joseph A. Iadanza, Hinesburg, both of VT (US); Paul A. Owczarski, Raleigh, NC (US); Jonathan H. Raymond, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/225,111

(22) Filed: Jan. 4, 1999

(51) Int. Cl.[7] .......................... G01R 31/28; G01R 31/08; G06F 11/00
(52) U.S. Cl. .......................... 714/716; 714/712; 370/245
(58) Field of Search .................... 714/712, 715, 714/716, 750, 751, 752, 746, 748, 10, 30, 31; 370/241, 242, 245, 248, 249, 351

(56) References Cited

U.S. PATENT DOCUMENTS

| | | | |
|---|---|---|---|
| 5,058,108 | * 10/1991 | Mann et al. | 370/85.1 |
| 5,168,497 | * 12/1992 | Ozaki et al. | 370/94.1 |
| 5,337,316 | 8/1994 | Weiss et al. | 714/716 |
| 5,402,440 | 3/1995 | Marbot | 375/10 |
| 5,648,972 | 7/1997 | Gharakhanian | 714/716 |
| 5,675,588 | 10/1997 | Maruyama et al. | 714/715 |

* cited by examiner

Primary Examiner—Christine T. Tu
(74) Attorney, Agent, or Firm—Scully, Scott, Murphy & Presser; Eugene I. Shkurko, Esq.

(57) ABSTRACT

A system and method for testing the most complex portions of transceiver devices integrated into digital VLSI chips. The testing is performed in a manufacturing environment with minimal external hardware and using a combination of test-specific circuitry and pattern algorithms built into a mixed signal transceiver implementing a test methodology suitable for application and measurement on a digital tester.

21 Claims, 12 Drawing Sheets

SYSTEM AND METHOD FOR MANUFACTURING TEST OF A PHYSICAL LAYER TRANSCEIVER

BACKGROUND OF THE INVENTION

1. Field of the Invention

The present invention relates generally to the field of self-test structures for communications devices such as transceivers, and more particularly, a system for testing complex integrated circuit communications transceiver devices.

2. Discussion of the Prior Art

Transceiver circuits used in network communication applications, e.g., Ethernet, are designed and built as stand-alone chips with a standardized digital communications port for connection to the digital domain. Due to their stand-alone nature, and the relative simplicity of early transceivers, it was relatively simple to test these chips functionally to verify both the logic portion of the chip, and the analog transmit and receive circuitry. Early transceivers were built using a current driving, wave shaping, digital-to-analog converter as a transmitter and multiple analog comparators as a receiver. Due to their relative simplicity, these structures could alternatively be tested by parts when integrated into a larger piece of silicon with the digital portion being tested via Level-Sensitive Scan Design ("LSSD"), the DAC portion being tested through a series of DC parametric measurements, and the receiver being tested through a latched receiver test.

As the speed and complexity of the transceiver circuits increases, however, so does the complexity of the receiver. Moreover, the complexity of the receiver increases at a faster rate than the complexity of the transmitter and the digital circuitry. The transmitter and the digital circuitry both may still be tested via traditional LSSD and parametric means with little test coverage impact. Newer receivers, however, generally contain variable equalization and gain circuitry, PLL driven clock recovery, peak detection, and AC coupled input circuitry with internal DC restoration which makes testing via DC parametric levels ineffectual. As a result, not only has functional test been required to verify the operation of the receiver, but such testing has generally needed to be performed over multiple cable lengths to insure that the equalization and gain range of the receiver can mitigate both signal loss and signal (primarily phase) distortion caused by varying lengths of cable over which the signal may travel.

Figure 1:
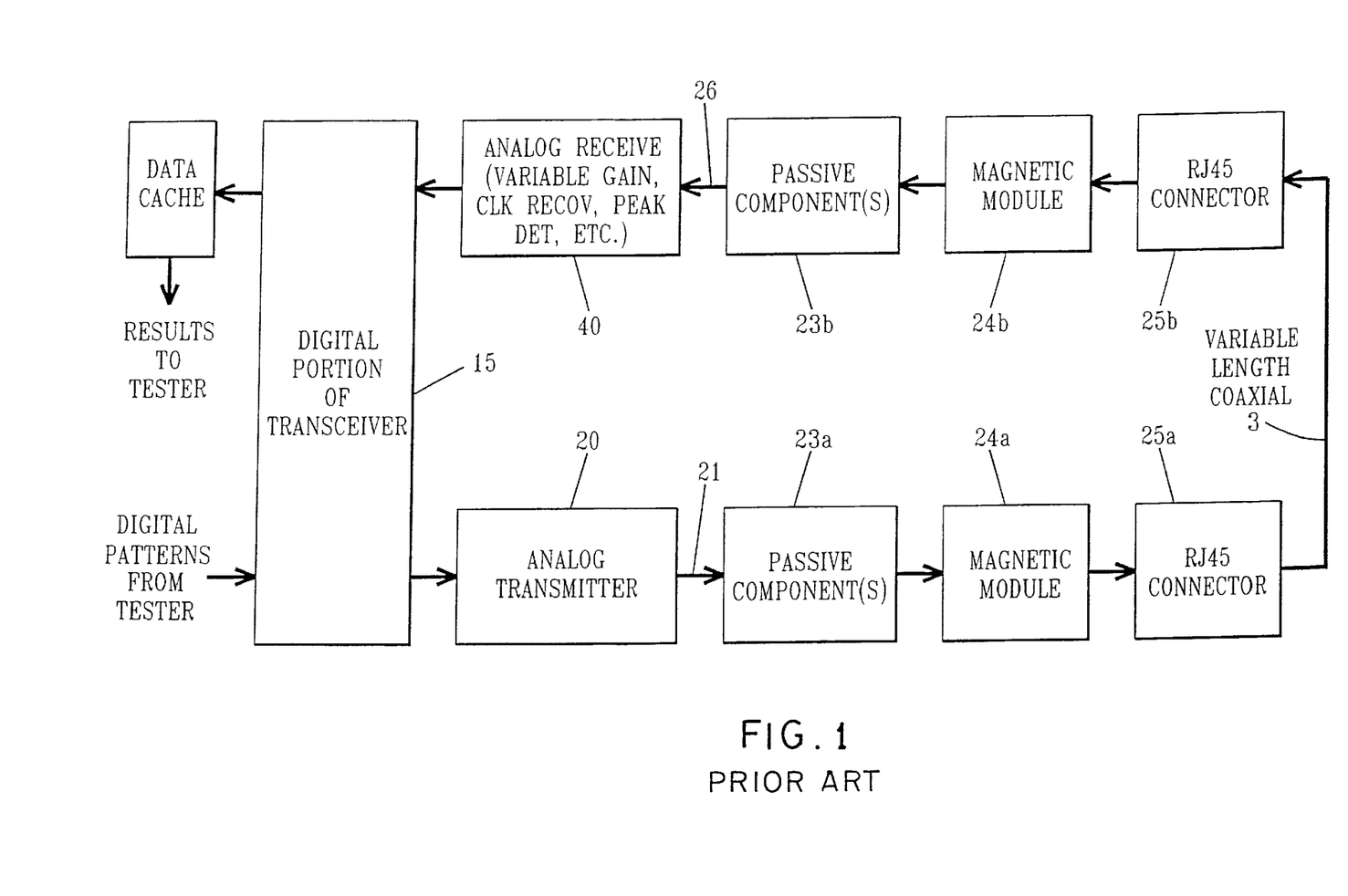
FIGS. 1 and 2 illustrate the data flow for current implementations of IC transceiver test methods.

FIG. 1 illustrates a data flow for an industry standard test methodology 10 such as described in the reference "ICS 1890 Test Plan Revision 3.0" ©1996 Integrated Circuit Systems, Inc. In this prior art method, all portions of the stand-alone transceiver chip are tested functionally at speed with repeated tests over multiple cable lengths, e.g, 1m–100m of cable, to test the ability of the device to adapt to, and successfully receive signals transmitted over varying lengths of cable. As shown in FIG. 1, the digital patterns from the tester (not shown) are input to the digital portion 15 of the transceiver under test, which generates signals for testing the analog transmitter portion 20. Outputs from the analog transmit portion 20 are current signals 21 which are input into passive components 23a and coil (magnetic) step-up module 24a for converting the current signals 21 into voltage signals suitable for input to the analog receiver portion 40 of the transceiver device. Depending upon the test, these analog voltage test signals are transmitted to the receiver 40 via variable length coaxial cables 30 having a pair of RJ45 connectors 25a,b and corresponding passive components 23b and step-down coil (magnetic) modules 24b for converting the test signals into the proper input signals 26 for the analog receiver.

Figure 2:
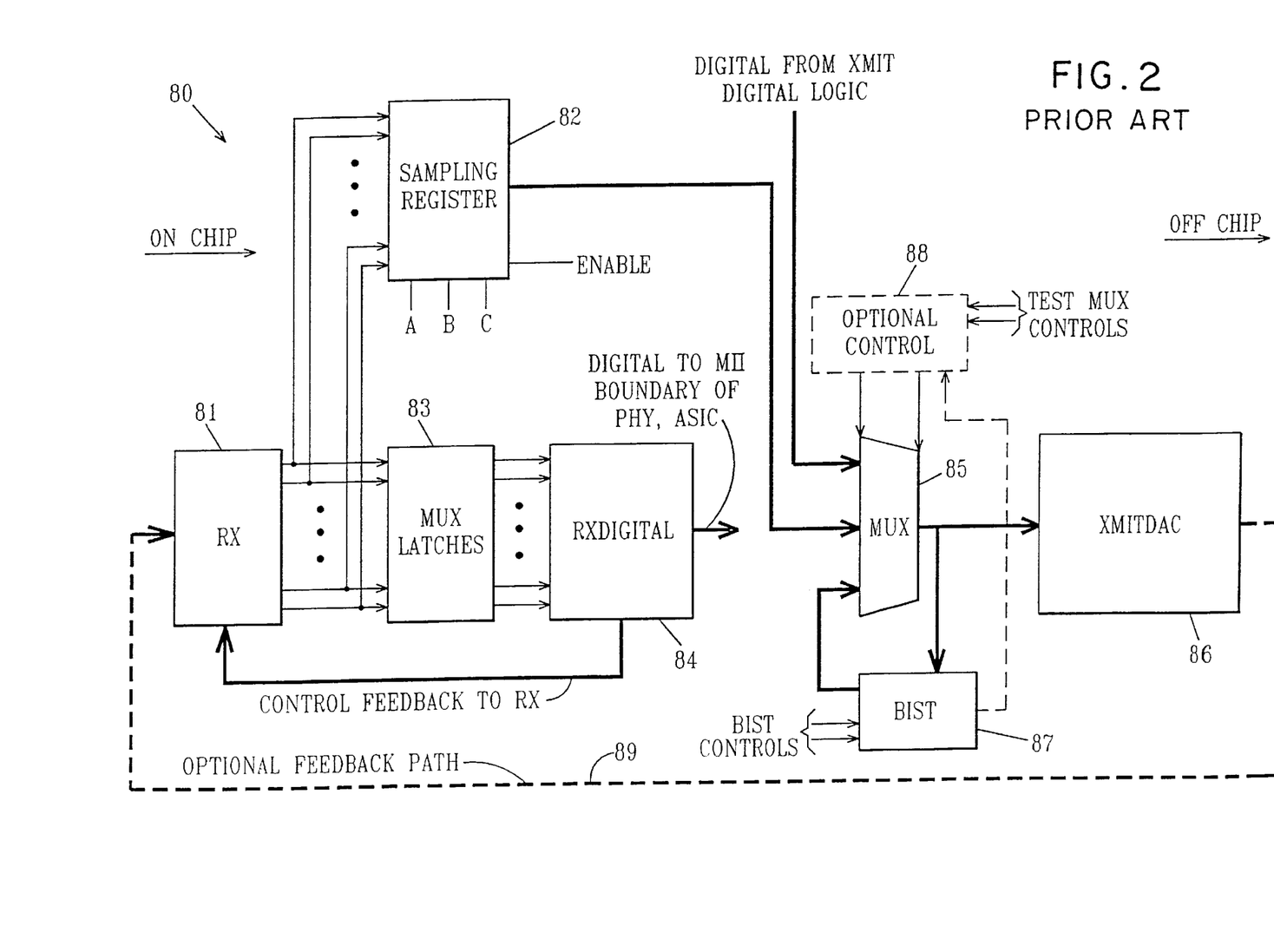

The reference entitled "System and Method for Analog Test and Trimming of a Transceiver Circuit," IBM Disclosure BU8-97-0336, 1997, describes an earlier test methodology 80, the likes of which is illustrated in FIG. 2. Using this methodology, analog signals brought into the transceiver and converted to digital signatures via RX port 81 could be sampled by register 82 at appropriate intervals during a test window. Composite samples stored in 82 may be selected as data input to the transmitter portion of the transceiver 86 via mux structure 85 and control logic 88. Measurement using external test equipment of the analog waveforms produced by transmitter 86 respondent to register 82 contents provides a means of both assessing the function of the receiver 81 via analog output measurement, and providing analog feedback to monitor resistor trimming processes common in the tuning of analog integrated circuits. Additionally, a method allowing transmitter 86 to alternately source analog test data which may be provided by a built-in-self-test (BIST) to the receiver 81 via an optional external connection 89 and provide analog signatures for the verification of receiver 81 using sampling register 82 and control logic 88 is described. The methodology also adds Mux Latches 83 to provide for digital test stimulus for the bulk of the receive digital function 84, and a built-in-self-test unit 87 to provide data patterns, primarily for analog verification of the transmitter 86. Other digital portions of the transceiver, not shown, are tested using standard digital methodologies such as level-sensitive-scan-design (LSSD), scannable flip-flops, or functional patterns.

Figure 3A:
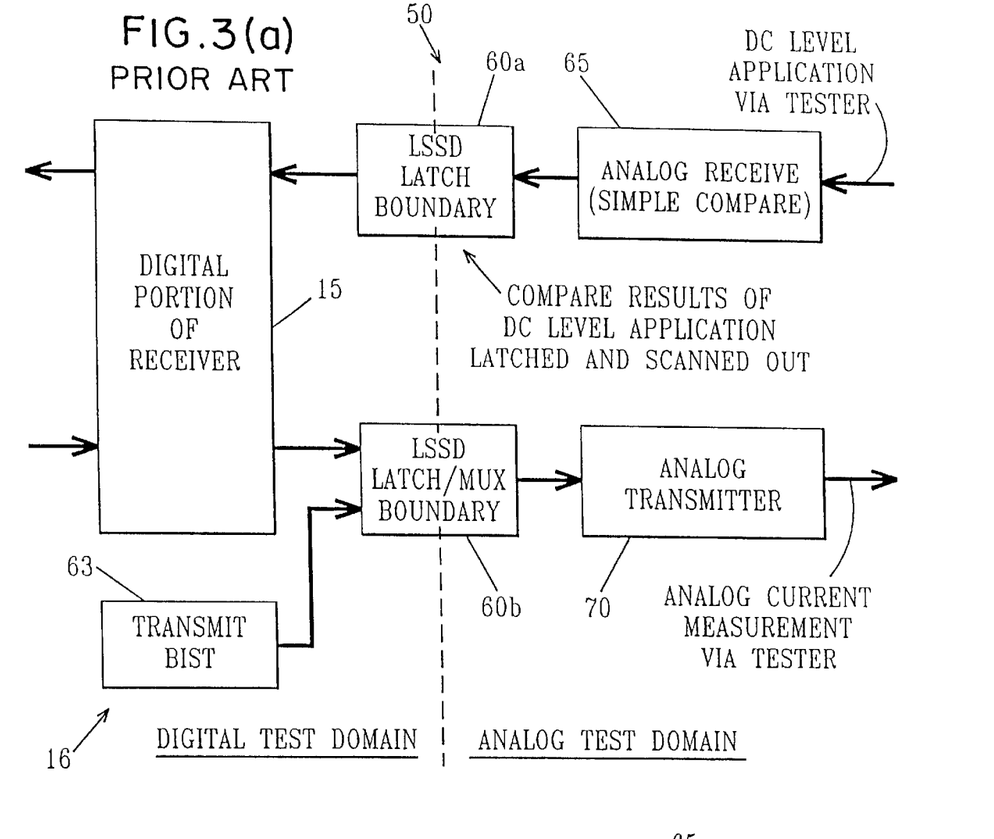
FIG. 3(a) illustrates generally the current test methodology employed for an IBM 10T Ethernet core transceiver.

A prior art test methodology implemented for IBM's 10T Ethernet core is illustrated in FIG. 3(a). As shown in FIG. 3(a), the transceiver device 50 is segmented into a receive portion 65, a transmit portion 70, and a digital portion 16 comprising a transceiver digital logic device 15, transmit BIST logic device 63 and mux/latch boundaries devices 60a and 60b, each device being tested separately. The digital portion 16 is tested via LSSD means with mux/latch boundaries 60a and 60b providing alternate stimulus at the analog-to-digital boundary and digital data sampling at the digital-to-analog boundary respectively. The transmitter 70 is tested via parametric measurement (i.e. current or voltage) with patterns driven by a transmit counter/built-in-self-test (BIST). The receiver 65 is tested via a latch receiver test similar in nature to ASIC receivers whereby the digital results of analog-to-digital conversion performed by receiver 65 on DC input signals are captured at the mux/latch boundary 60a for scanout and verification via the tester.

Figure 3B:
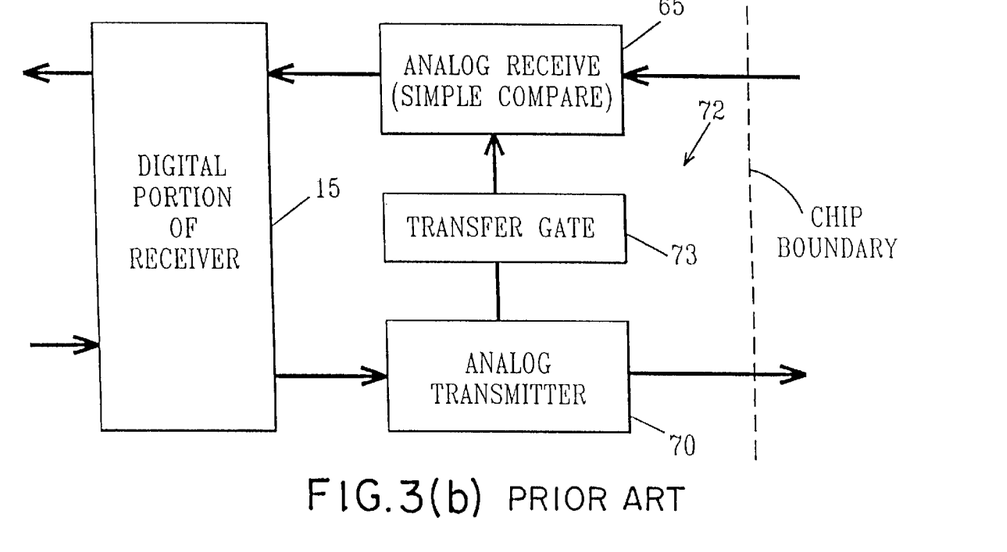
FIG. 3(b) illustrates generally the current test methodology employed for an IBM token ring transceiver.

FIG. 3(b) illustrates a test methodology for the IBM token ring transceiver embedded into a silicon chip which includes an on-chip analog loop back path 72 including a transfer gate 73 for providing an internal bridge between the analog transmitter 70' and receiver 65' in the circuit and used to test the receiver portion of the circuit.

In addition to the references cited above, U.S. Pat. Nos. 5,337,316, 5,402,440, 5,648,972 and 5,675,588 each described methodologies for testing communications devices, with U.S. Pat. No. 5,648,972 particularly directed to testing of a single integrated circuit transceiver.

Functional single IC transceiver testing of the nature as shown in FIG. 1, uses the transmitter portion to drive the receiver and requires complex board design to include passive components and coaxial connectors, as well as the ability to switch in and out coaxial cable lengths from 1 meter to more than 100 meters in order to "generate" the receive signal used for test. Generally, because the circuit is allowed to auto-converge to an equalization and gain setting, the test time for each cable length is greatly increased, e.g., to more than four seconds, while the data collection and verification methodology becomes complex, requiring either on-board or on-tester data collection and post-processing to handle the variable latency of the different cable lengths and the high data rate of the communications port. These factors make implementation of this test methodology in a digital test manufacturing environment extremely difficult, especially when multiple port counts which may exceed twelve (12) are contained within a single piece of silicon.

Thus, the need exists to test such chips in an inexpensive manufacturing test setting which provides a means of receiver test while eliminating requirements for external coaxial cable and external data collection and post-processing.

SUMMARY OF THE INVENTION

The present invention is directed to a system and method for testing complex portions of hybrid (analog and digital), stand-alone integrated circuit transceivers in a manufacturing environment with minimal external hardware. Using a combination of test-specific circuitry and pattern algorithms built into the mixed signal transceiver, a test methodology suitable for application and measurement on a digital tester is provided, without the need for external coaxial cable and external data collection and post-processing.

According to the principles of the invention, there is provided a transceiver device for receiving and transmitting data over a network comprising a built in self test (BIST) device for generating and transmitting data signals representative of signals capable of being transmitted over a network, the BIST further generating a control signal for impairing characteristics of the representative signal; a transmitter device for receiving the representative network data signals and the impair control signal and generating an output signal corresponding to the representative network data signals and having an impaired characteristic according to the impair control signal; a receiver device for receiving the output signal from the transmitter device and for reconstructing the representative network data, the BIST device receiving the reconstructed representative network data and detecting erroneous performance by the transceiver from the reconstructed representative network data.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which.

DETAILED DESCRIPTION OF THE INVENTION

Figure 4:
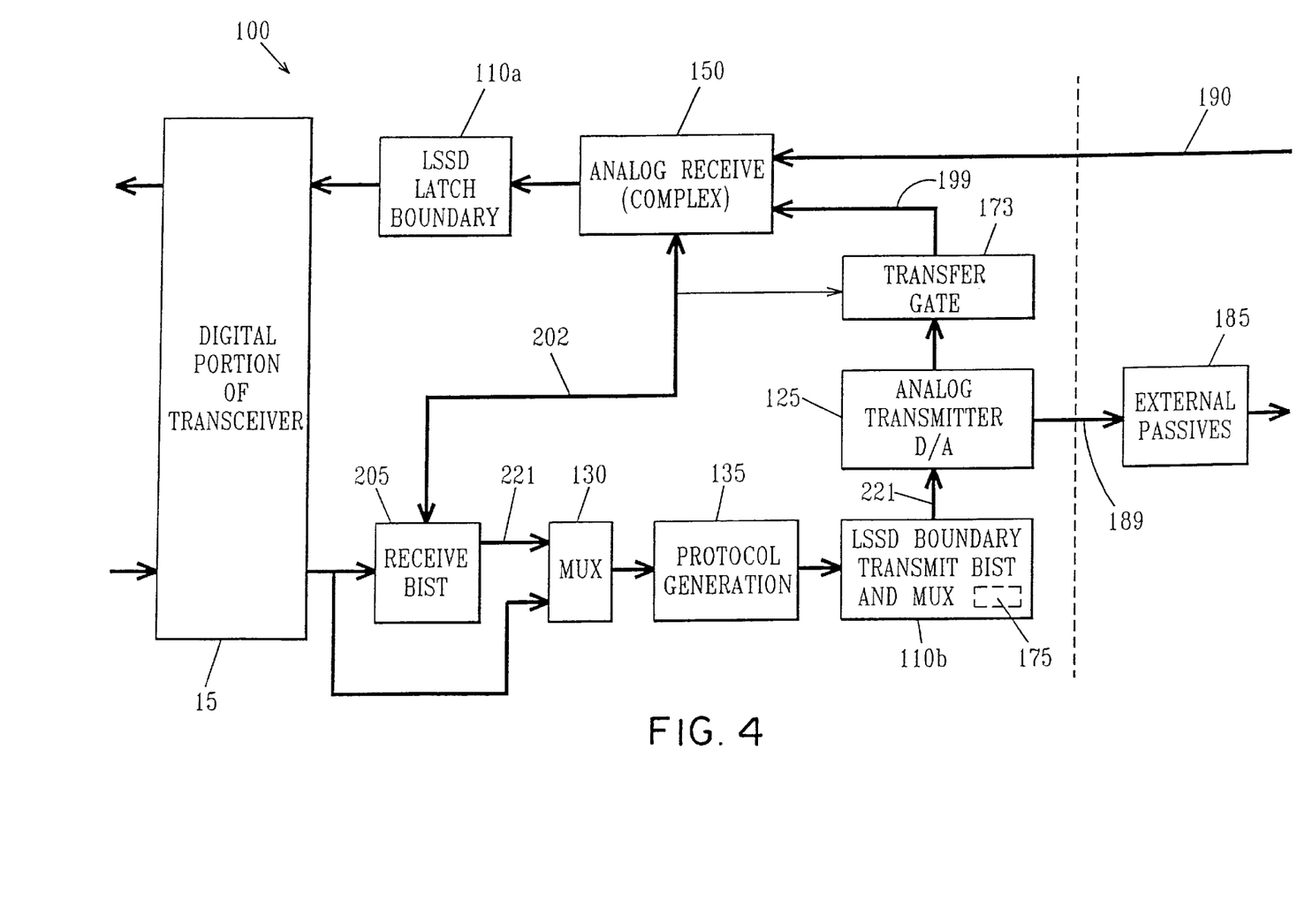
FIG. 4 is a high-level flow diagram depicting the inventive test system and methodology for testing a complex integrated transceiver circuit.

FIG. 4 illustrates the test device architecture 100 of the invention for testing a single chip transceiver device employed, e.g., in local area network applications. As shown in FIG. 4, the single chip transceiver to be tested according to the test methodology 100 of the invention includes a digital domain portion 75, an analog transmit portion 125, and an analog receiver portion 150 of state-of-the-art complexity containing variable gain/equalization, AC termination, peak detection, DC restoration, and PLL driven clock recovery, and, a novel Built-In Self-Test "BIST" level device including a transmit BIST component 175 which is used to create data patterns for measurement/verification of the analog transmitter DAC, and a novel receive BIST component 205 for driving the receiver portion 150, testing and analyzing the receiver data with minimal tester intervention.

As additionally shown in FIG. 4, the testing system 100 of the invention includes the LSSD latch boundaries 110a, 110b such as provided in the testing device of the original 10T transceiver shown in FIG. 2, for isolating the digital domain 15 from the analog transmit/receive domain and for providing LSSD test of the digital domain which covers all digital functions, including the digital adaptation circuitry which would normally drive the analog receiver (connection not shown). The circuit 130 provides a multiplexor function for receiving signals from the receive BIST and digital domain portion of the test circuit 100, while the circuit 135 provides a protocol generation function enabling generation of specific signals in accordance with a particular transmit communications protocol, e.g., multi-level transmit (MLT3) used in 100TX Ethernet communication, or Manchester protocol, etc.

Added to the original implementation of the transmit BIST 60b (FIG. 2), is the novel receive BIST 205 which provides alternative, programmable data to the protocol generalization logic of the transceiver, controls the adaptation setup of the analog receiver, thereby bypassing adaptation convergence (tested in the digital domain) and, speeds test and compression of the data received at the receiver port. The new receive BIST 205 additionally may assert control over protocol generation to disable scrambling methodologies present in some transceivers. Additionally, the loopback path from the token ring design (FIG. 3) is provided for implementing a selectable on-chip path for use during test.

As further shown in FIG. 4, a set of external passive devices 185 may be provided (off-chip) at the output 189 of the transmitter 125 to convert the transmitter output, which is a current, into a voltage, which is internally transmitted (on-chip) to the inputs of the receiver via transfer gate 173, thus, obviating the need for magnetic coil and coax connectors as previously required (FIG. 1). Network connections (not shown) beyond the passive components of the transmitter and coming from off-chip on the receiver may be allowed, but are not necessary for the receiver test methodology of the invention.

Figure 5:
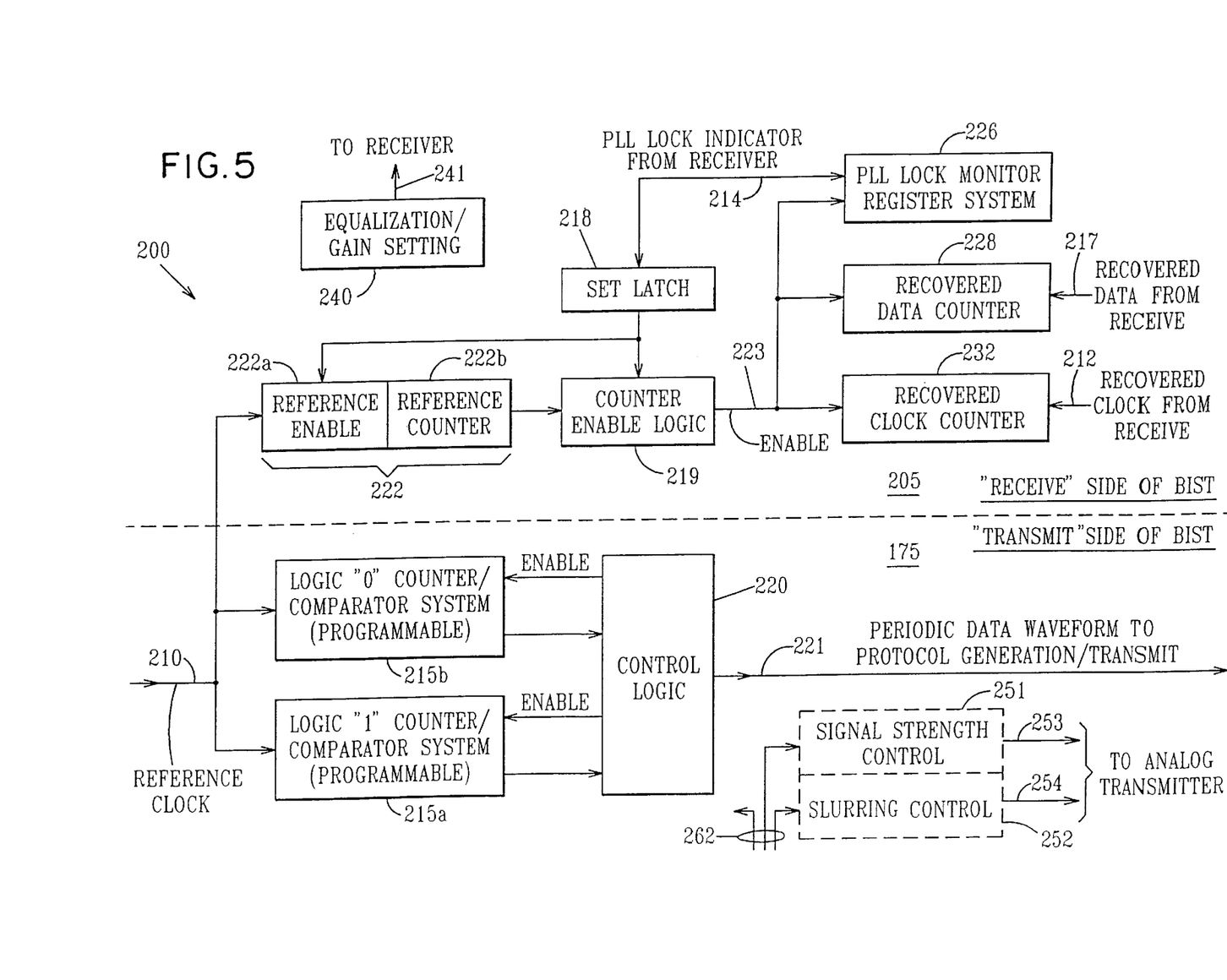
FIG. 5 is a block diagram depicting the operation of the novel transmit and receive BIST function provided in the testing system of the invention.

FIG. 5 is a flow diagram depicting the novel BIST function having a transmit portion 175 used to generate periodic digital data pattern for transmission to the analog receiver 150 without connectivity to the edge of the chip in which the transceiver is embedded; and, a receive BIST portion 205 for providing the testing of the analog receiver portion 150. Example signal waveforms present at the transmit and receive-side BIST components for an example Ethernet 100Tx transceiver operation are shown in FIGS. 6(a)–6(h).

Figure 6A:
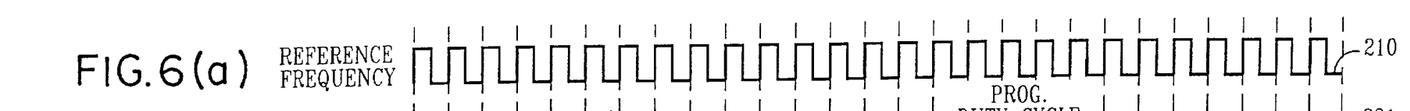
FIGS. 6(a)–6(h) provide example waveforms for a 100Tx test configuration implemented by the system of the invention.
Figures 6B, 6C:
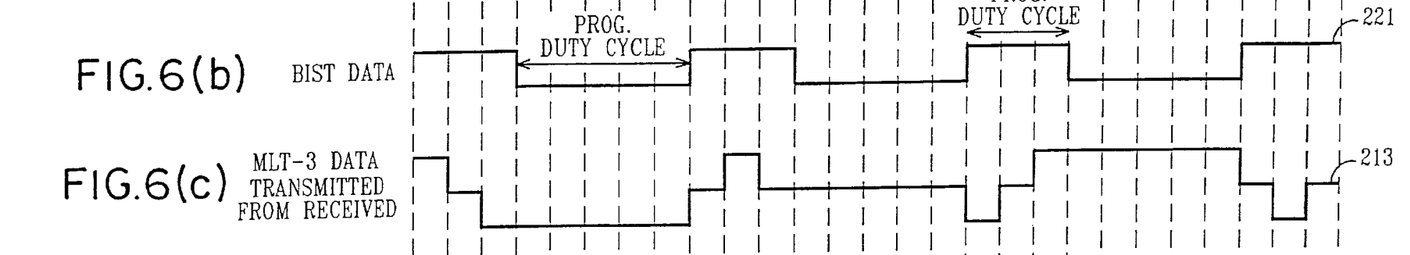
Figure 6D:
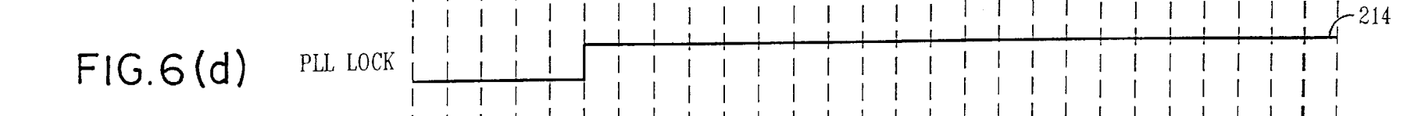
Figure 6E:
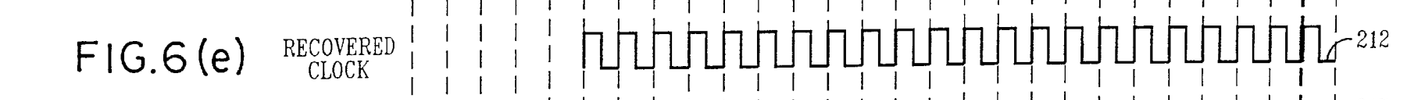
Figure 6F:
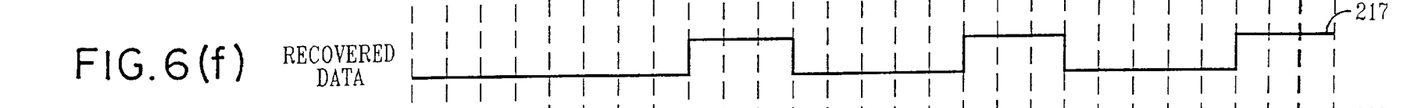

With regard to the transmit BIST portion 175, a sequential data bitstream(s) is generated for input to the analog transmitter 125 at the nominal data rate for producing the proper frequency to be fed to the receive circuitry 150 of the transceiver. Two independent programmable "1's" and "0's" counter/comparator systems 215a and 215b are respectively coupled with BIST control logic circuitry 220 to enable programming and alteration of both the digital data "frequency" and data "duty cycle" of the digital data signal 221 to be transmitted to the protocol generation unit 135, as shown in FIGS. 4 and 5. In the preferred embodiment, the counter comparator systems 215a and 215b receive a reference clock input signal 210 (FIG. 6(a)), e.g., at 125 MHZ for the example Ethernet 100TX communications transceiver, and are programmed to generate a BIST signal 221 (FIG. 6(b)) comprising a series of logic level 1's and 0's at the desired test frequency and duty cycle for input to the protocol generator and/or analog transmitter 125 (FIG. 4). For the example programmed signal 221 (FIG. 6(b)) input to the protocol generator, the resultant analog MLT-3 data waveform 213 transmitted from the analog transmitter 125 coupled to the external passive devices 185 (FIG. 4) is shown in FIG. 6(c). It should be understood that use of the two independent programmable counter comparator systems 215a and 215b and control logic circuitry 220 enables generation of a data waveform which may be used for testing analog receiver sensitivies such as long periods of inactivity which may test PLL, DC restore, or peak detect circuits, or high levels of activity which may test circuit response. If scrambling is generally implemented in protocol generation, the BIST 175 also operates to disable the scrambling and allow for the unscrambled data to be sent on the line.

Operation of the receive side 205 of the BIST is now described in view of FIGS. 4 and 5. For the Receive BIST 205, equalization and gain setting circuitry 240 is provided for generating signals 241 representing equalization and gain settings for input to the analog receiver 150 and which are used to eliminate the convergence time for variable gain adaptation, thereby reducing the effective clock recovery PLL lock time during test. Particularly, the receive side of the BIST uses a system reference clock 210 along with the received serial bitstream 217 from the receiver, a recovered clock signal 212, and PLL lock signal 214 from the analog receiver 150 to analyze the receiver function.

Particularly, as shown in FIG. 4, a bi-directional bus 202 between the receiver 150 and the receive BIST 205 includes signal lines enabling BIST receipt of serial bitstream 217, PLL lock indicator 214, and recovered clock signal 212, and, further enabling communication of receiver equalization/gain settings to the receiver 150 and transfer control gate signal 203 to the transfer gate 173.

In operation, a PLL lock signal 214 is input from the receiver indicating that the received clock signal has been locked. At the receipt of the PLL locked signal 214, a latch circuit 218 is set to enable four counter-monitoring systems within the BIST. The first of these counter/monitoring systems is a reference counter system 222 including an enable circuit 222a and counter circuit 222b which is reset prior to BIST start, and begins counting reference clock cycles 210 when the clock recovery system locks. This counter system 222 provides a sampling window of known value and is programmable so as to provide window tailoring. Particularly, the counter output of the reference counter 222b is input to a counter enable logic circuit 219 which generates an enable signal 223 for enabling counter/monitoring operation of the counter/monitoring systems for the pre-determined window of time. The second counter/monitoring system comprises a PLL lock monitor circuit 226 responsive to the enable 223 signal for monitoring the PLL lock signal 214 (FIG. 6(d)) and ensuring that once locked, the PLL does not unlock during the duration of the test as defined by the reference counter system 222. The PLL lock monitor circuit is also capable of providing readout in cases where the PLL did not lock initially. The third counter/monitoring system comprises a recovered data counter circuit 228 enabling frequency measurement of the recovered data signal 217 (FIG. 6(f)) as data is transmitted as a periodic signal. The recovered data counter circuit 228 particularly provides a transition count during the defined reference counter window. The fourth counter/monitoring system comprises a recovered clock counter circuit 232 for measuring the number of transitions of the recovered clock signal 212 (FIG. 6(e)) during the reference counter window.

Figure 6G:
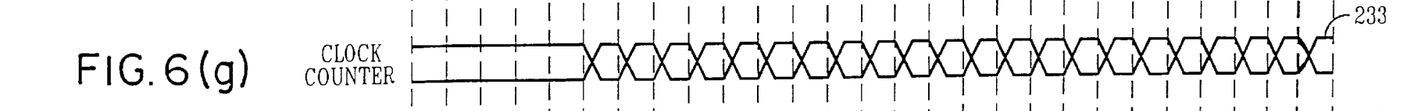
Figure 6H:
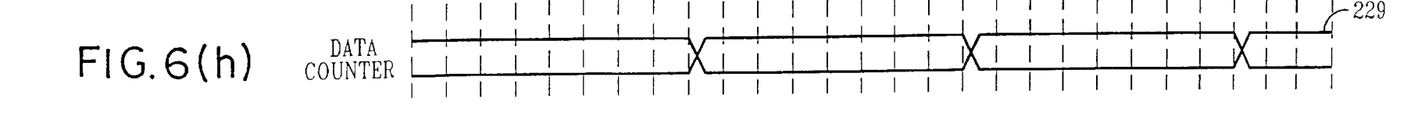

As shown in FIG. 4, when the BIST system is initially started, a periodic data signal 213 is broadcast from the transmitter 125 in conjunction with external passive devices 185 as connected by transmitter output 189, for receipt by the analog receiver 150. The voltage developed at output 189 appears across the connection between transfer gate 173 and transmitter 125 which is a second branch off the output 189. The voltage waveform is gated by transfer gate 173 and allowed to propagate to the receiver via connection 199 between the transfer gate 173 and the receiver 150. It should be understood that lines 190 and 199 converge inside the receiver 150, however, line 190, the functional input, is left unconnected in test mode. Once the data is received and successfully locked, the four counter systems 222, 226, 228 and 232 are enabled. The second, third, and fourth system counter transitions on key receiver outputs while the reference counter is less than the programmed maximum value and disregards transitions outside this time window. The reference clock 210 of the transceiver and BIST (FIG. 6(a)) run long enough to allow the specified lock time for the PLL, measurement time as defined by the reference window, and a time buffer; but it should be understood that the actual number of cycles is not critical as long as the window is sufficiently large so as to minimize the uncertainty caused by the exclusion of the least significant bit(s) in the result comparison. Once the number of functional cycles is completed, the transceiver chip may be returned to LSSD mode, and the contents of the BIST may be scanned and checked. The contents of the reference counter 222b may be used to insure that the time period between PLL lock and test termination was sufficient to complete the window, and also verifies the upper bound of the lock time for the PLL since only a predetermined number of reference clock cycles are allotted to occur in the test. The lock monitor contents verify that the PLL initially locked, and that it did not unlock during the reference window. The recovered data counter 228 may be checked to ensure that the proper number of transitions, as calculated by the data frequency rate and the reference window width minus some least significant bit uncertainty due to the asynchronous nature of the reference clock to recovered data, was found. An example timing diagram showing the number of data counter transitions 229 is shown in FIG. 6(h). The recovered clock counter 232 may be checked to ensure that a proper number of recovered clock pulses as calculated by the expected mean frequency of the recovered clock and reference window minus some LSB uncertainty for the asynchronous nature of the clocks, was found. An example timing diagram showing the number of clock counter transitions 233 is shown in FIG. 6(g). As the system is self timing, no external data collection and post processing is required in the system. Additionally, the system provides a level of AC performance testing of the driver not previously accomplished via on-chip test assists.

According to the invention, in order to eliminate the need for cable-induced signal attenuation, a test-specific transmitter 125 is provided as shown in FIG. 4 that is capable of transmitting data in a format identical to the functional transmitter, but with lower peak-to-peak signal swings to approximate the attenuation of a specified length of cable. Particularly, the following additional circuitry is present in the transmit BIST 175 of FIG. 5: a programmable signal strength control circuit 251 providing controlling signals 253 for controlling transmit driver circuits of the analog transmitter to provide output analog transmitter signals of varying strengths; and, a programmable slurring control circuit 252 providing control signals 254 for controlling transmitter drivers capable of distorting the analog transmitter signal output, as will be herein described. Each of these circuits and the additional provision of equalization/gain setting control enables full multiple signal strength corners testing without external cabling or relays. The test-specific driver (not shown) may be implemented using a subset of fingers of the functional driver, or may comprise one or more separate drivers in order to provide additional test corner granularity. If multiple protocols are supported within the driver, multiple protocol test-specific drivers may also be implemented.

Figure 7:
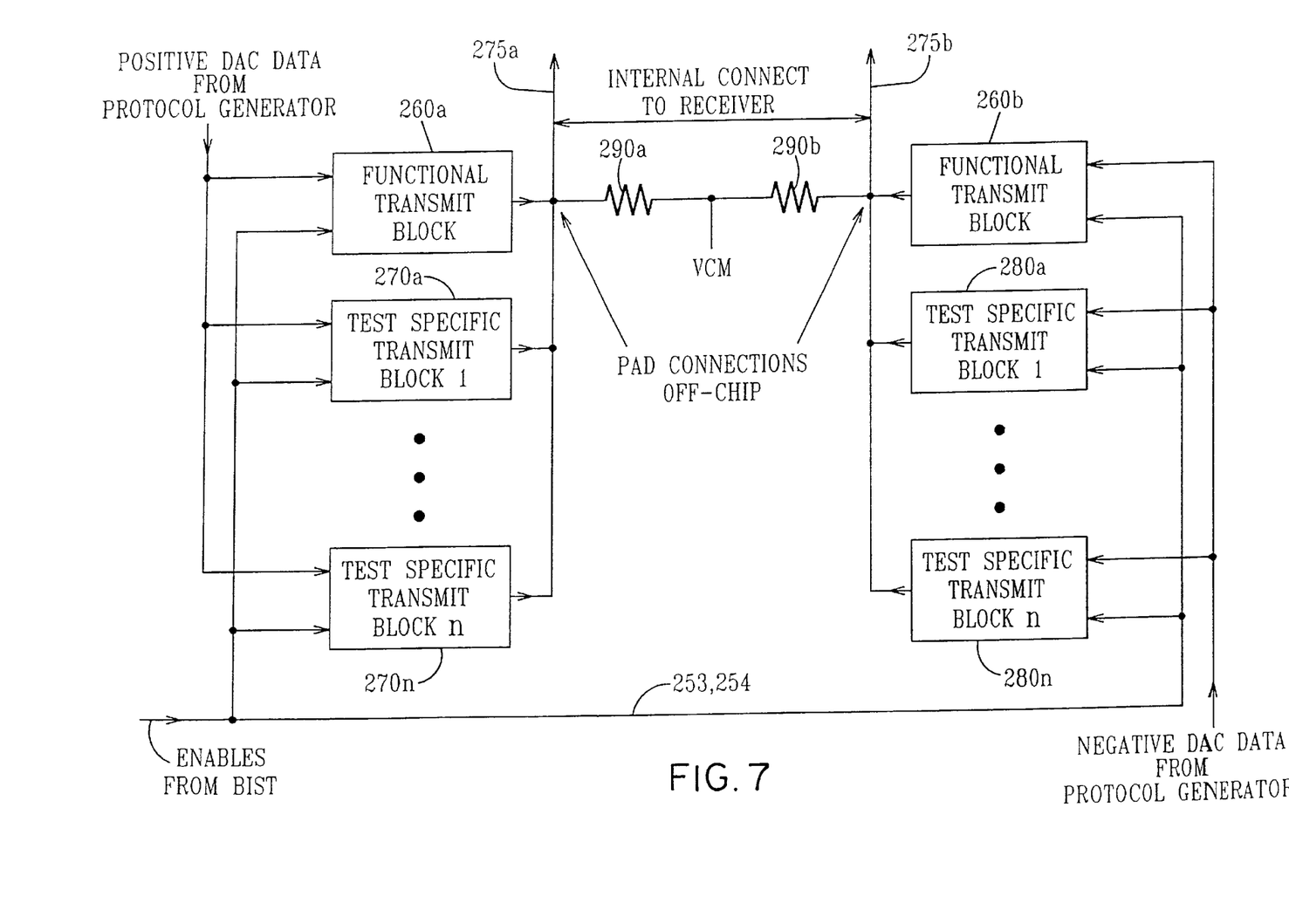
FIG. 7 is a diagram depicting functional transmitter components and test-specific transmitter components in the transceiver transmit device.

FIG. 7 illustrates an example transmit driver element including functional transmit blocks 260a, 260b comprising digital/analog converter elements for receiving respective positive and negative digital/analog conversion data from the protocol generator circuit 135 (FIG. 4) for functional operation. These functional transmit blocks are designed according to the particular transmitter, e.g., Ethernet 100TX, and communications protocol implemented. Additionally, according to the invention, the analog transmitter may be provided with one or more test-specific transmit blocks 270a–270n connected in parallel with the functional transmit block 260a, and test-specific transmit blocks 280a–280n connected in parallel with the functional transmit block 260b. Each of these test-specific transmit blocks may receive enable signals 253 from the transmit BIST 175 (FIG. 5) in order to control the signal strength of the analog transmitter output signals and are designed according to the particular transmitter, e.g., Ethernet 100TX, and communications protocol implemented.

Addition of the test-specific transmit driver blocks 270a–270n and 280a–280n of FIG. 7 not only allows for on-chip attenuation of the signal, but further provides slurring control, i.e., distortion, of the transmitted test signal. That is, the test-specific transmit driver blocks 270a–270n and 280a–280n of the analog transmitter 125 may be programmed to mimic distortion of an output waveform for testing the analog receiver under non-ideal conditions. For example, the transceiver analog transmitter 125 may be programmed to generate signals exhibiting inter-symbol interference (ISI) distortion, which is a property of the "memory" of the transmission cable not present in the short connection between the receiver and driver. To achieve such distortion in the transmitter output signal, the additional test-specific transmit driver blocks 270a–270n and 280a–280n may be programmed to misshape an otherwise sinusoidal output of the transmitter to create a non-ideal input to the analog receiver 150 (FIG. 4). This may be additionally accomplished by adding a test clock source of high jitter into the transmitter or by adding extra drive fingers which are timed to produce slurring of the output waveform, when enabled. In FIG. 7, control of the slurring and/or jitter selection functions is provided by the receive BIST structure and particularly slurring control signals 254.

As illustrated in FIG. 7, many driver circuits have a means of forcing a common mode voltage at their output. In these cases, the BIST 200 may also generate a control signal (enable signals 253, 254) for disabling the receiver side common mode generation (if present) to allow for internal analog wrap test of the transceiver. As shown in FIG. 7, external (off-chip) resistors 290a,b may be provided to force a common mode voltage at their internal output lines 275a,b. It is understood that internal resistors may be implemented which may be switched by the BIST 200 in test mode for providing voltage generation at a lower accuracy should this be sufficient for test purposes.

As it is often desirable to test the response of the receiver due to low frequency common mode variation, and DC wander, the transmitter output test signals can be distorted to include these characteristics by varying node VCM of the driver as shown in FIG. 7. By varying VCM around its center point, DC wander is introduced into the test signal. This simulates the effect of the high pass characteristic of the magnetics, without requiring their existence on the test board. By applying an AC signal to VCM, the effects of low frequency common mode variation on the receiver may be tested.

Figures 8, 8A:
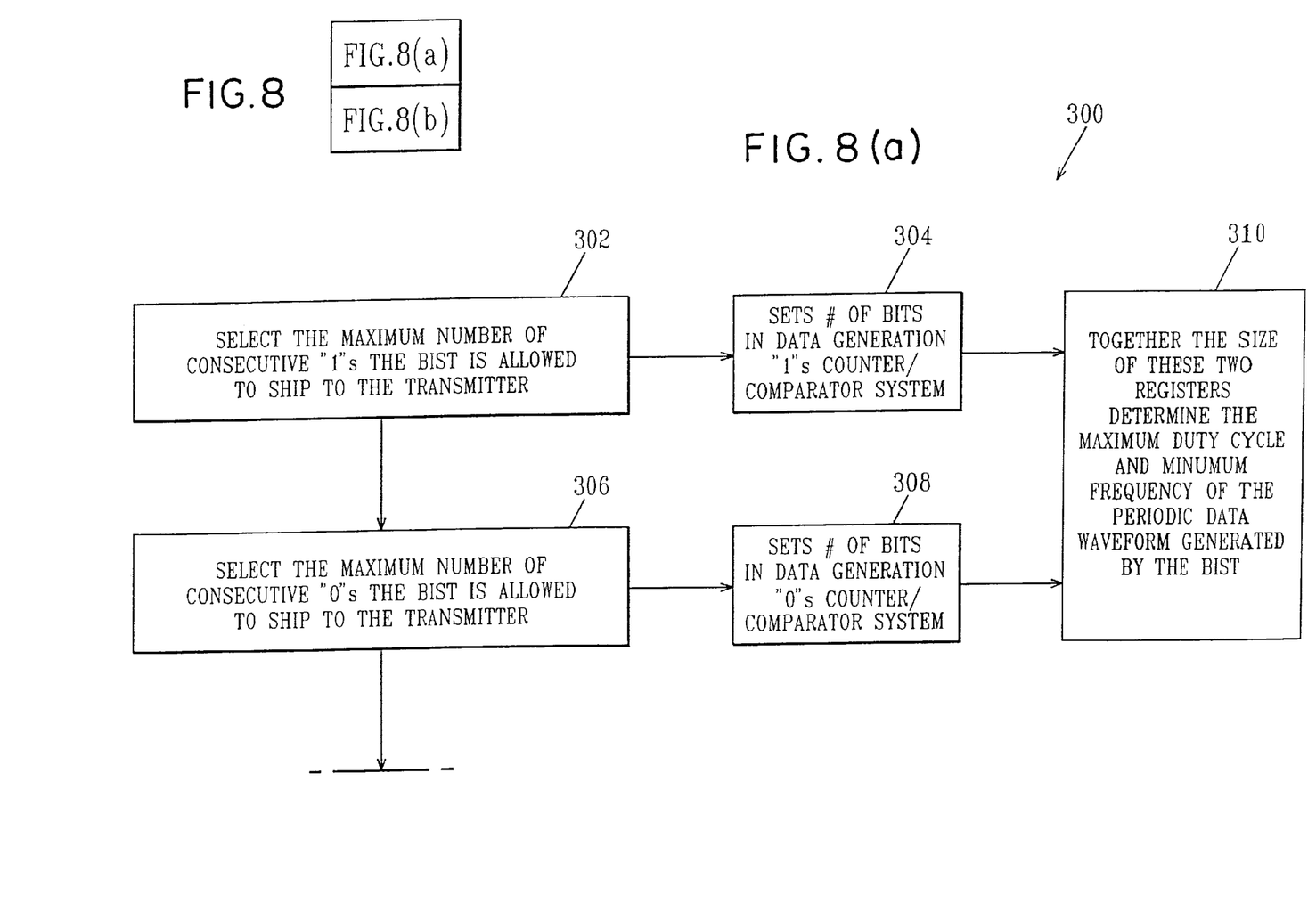
FIG. 8 is a flow diagram depicting transceiver test design considerations.
Figure 8B:
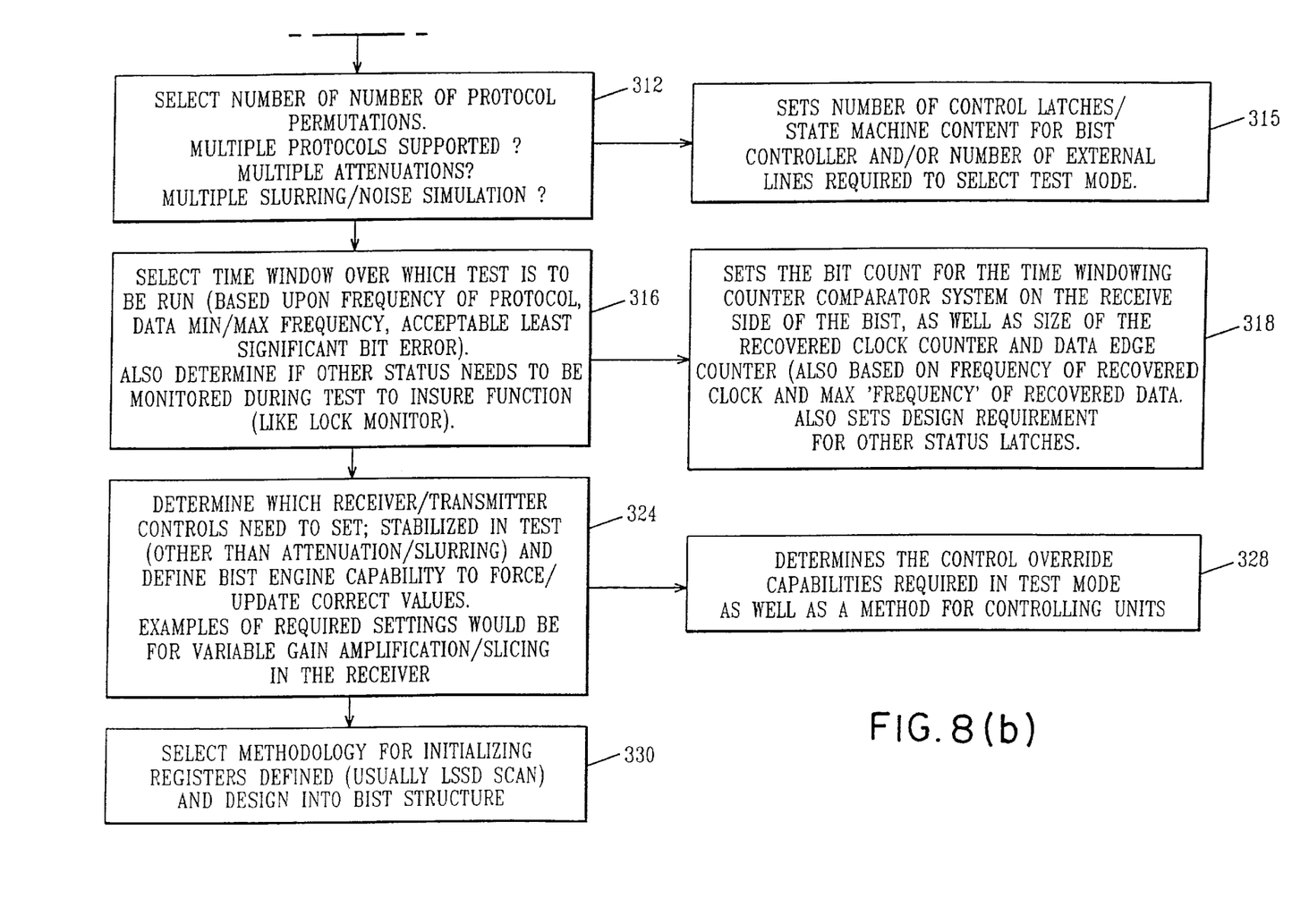

FIG. 8 is a flow chart depicting the primary design considerations for testing the transceiver device 10 of the invention. As indicated at step 302, a first requirement is selection of the maximum number of consecutive "1's that the transmit BIST 175 may input to the analog transmitter 125 which would require setting the number of bits in a register (not shown) included as part of the data generation "1's" counter/comparator system 215a, as indicated at step 304. Likewise, as indicated at step 306, a decision is made as to the maximum number of consecutive "0's that the transmit BIST 175 may input to the analog transmitter, which would require setting the number of bits in a register (not shown) included as part of the data generation "0's" counter/comparator system 215b as indicated at step 308. These two register settings together determine the maximum duty cycle and minimum frequency of the periodic data waveform generated by the BIST. Moreover, the sizes/capabilities to support the registers may also be determined.

Next, at step 312, a determination is made as to whether multiple protocols, e.g., Manchester, MLT3, are supported by the transceiver drivers, and further, whether multiple attenuations and slurring/noise simulation devices and number of protocol permutations are supported for transceiver test. Accordingly, as indicated at step 315, this would require setting the number of control latches/state machine content for the BIST controller 220. In cases where these nodes are to be controlled externally, the number of lines 262 designed into the system to provide selection of desired test nodes, is set.

Then, at step 316, the time window over which test is to be run is determined based on the following data criteria: the frequency of protocol, the data minimum/maximum frequency, and the acceptable least significant bit ("LSB") error. For example, if a low frequency transmitter operation is tested, a longer time window may be needed as compared to a high frequency test. A further determination may be made if any other status is to be monitored during test, e.g., PLL lock monitor which must indicate a "locked" status throughout a test cycle. Accordingly, as indicated at step 318, a bit count for the time windowing counter 222b on the receive BIST 205 is set, as is the size of the recovered clock counter 232 and data edge counter 228 based on frequency of recovered clock and maximum frequency of recovered data, respectively as determined by the particular protocol and transceiver, e.g., 10T, 100Tx, etc.

Then, at step 324, a determination is made as to which receiver/transmit controls (other than attenuation/slurring) need to be set/stabilized in test, e.g., variable gain amplification/slicing in the receiver. Furthermore, a BIST engine capability is defined to enable forcing or updating of correct control values. Accordingly, at step 328, the control override capabilities required in test mode, as well as a method for controlling these units, e.g., receiver slicing, equalization, feedback loops, variable gain amplification etc. is set. Finally, at step 330, a methodology for initializing LSSD scan registers that are designed into the BIST structure is selected.

Figures 9, 9A:
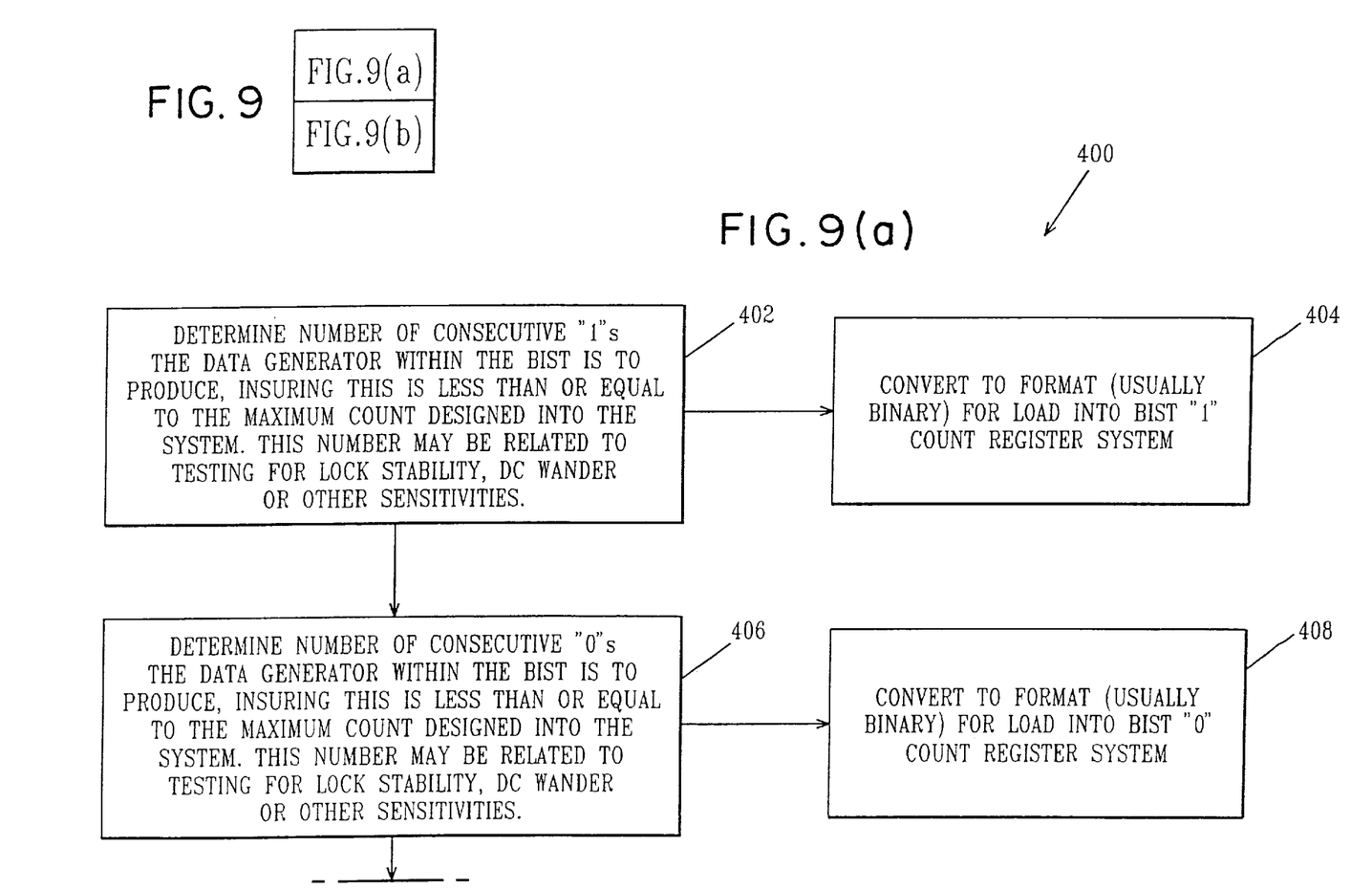
FIG. 9 is a flow diagram depicting test programming design considerations corresponding to the transceiver test design considerations.
Figure 9B:
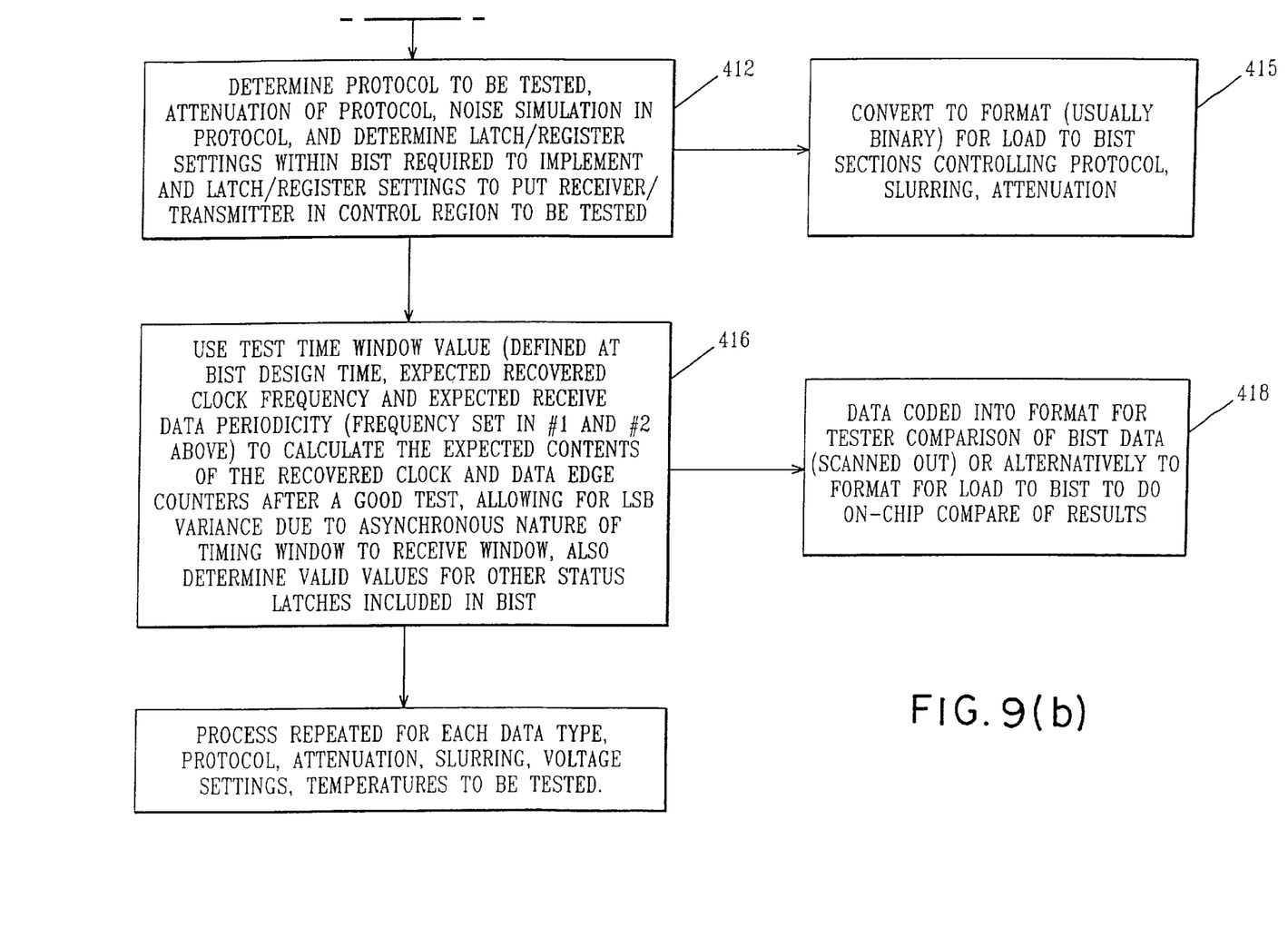

An example program 400 implementation for testing transceiver performance is depicted in FIG. 9. At first steps 402 and 406, the number of consecutive 1's and 0's are programmed into the data generator within the BIST, which, in the preferred embodiment, is less than or equal to their respective maximum counts designed into the system. This may, for example, require conversion of a binary format value for load into BIST into respective BIST "1" and BIST "0" counter register systems 215a, 215b (FIG. 5), as indicated at steps 404 and 408. Then, at step 412, the transmit protocol for the transceiver to be tested is determined and, accordingly, any signal attenuation and noise simulation in protocol is programmed into the BIST structure. Additionally, programmed into the BIST latch/register settings are the parameters required to put both the receiver and transmitter in the control region to be tested. As indicated at step 415, this may, for example, require conversion of a binary format value for load into BIST slurring control attenuation, and protocol control (data generator) devices.

Then, as indicated at step 416, the program utilizes the test time window value defined at BIST design time (step 316, FIG. 8), expected recovered clock frequency and expected receive data periodicity (set at steps 402 and 406) to calculate the expected contents of the recovered clock counter 232 and data edge counter 228 for a good test. Preferably, this calculation takes into account possible LSB variance due to asynchronous nature of the timing window to receive windows. As indicated at step 418, all data may be suitably coded to enable (LSSD) scanned out test comparison of BIST data, or, alternately, may be formatted for loading into the BIST for on-chip comparison results. It should be understood that steps 402–418 of FIG. 9 may be repeated for each data type, protocol, attenuation, slurring, voltage settings, temperatures to be tested, etc.

Figure 10:
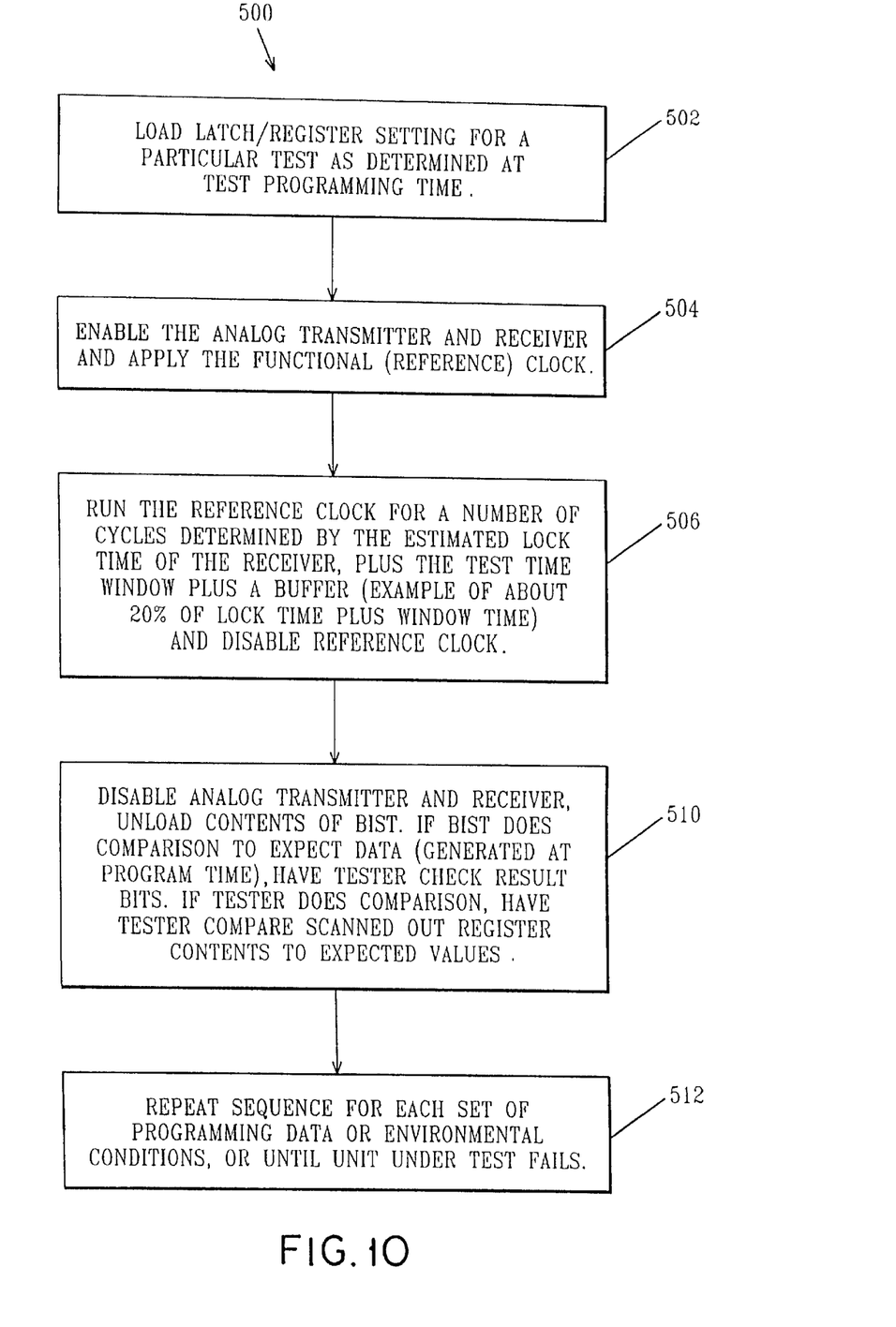
FIG. 10 illustrates a test execution flow for transceiver test.

The test execution program 500 implemented for transceiver testing is now described with reference to FIG. 10. As shown at first step 502, the latch and register settings for the particular test are input to the BIST. At step 504, the analog transmitter and receiver devices are enabled and the functional reference clock 210 (FIG. 5) is run for a number of cycles as determined by the estimated lock time of the receiver, and, by the receive BIST test time window, as indicated at step 506. The reference clock may be disabled at this point. Finally, at step 510, the analog transmitter and receiver are disabled, and the contents of the recovered data counter 228 and recovered clock counter 232 are unloaded from the BIST. It should be understood that an on-chip comparison may be implemented in the BIST to compare the recovered data and clock frequency data with their respective expected values, as well as compare the expected value of the lock monitor system and reference window counter for correct values. These recovered values preferably are scanned out for comparison with expected values. As indicated at 512, the sequence of steps 502–510 may be repeated for new sets of programming data; for testing under various environmental conditions; or, until the unit under test fails.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A system for testing an integrated circuit analog communications transceiver device having an analog transmitter and an analog receiver, with said analog transmitter generating test signals for input to said receiver, said system comprising:

an on-chip programmable signal generator circuit for providing programmed data patterns for continuous input to said analog transmitter, said analog transmitter portion generating receiver test signals according to said programmed data patterns for continuous output during a predetermined time window;

means within said integrated circuit for switching said generated analog receiver test signals from said transmitter to said analog receiver, said analog receiver including circuitry for generating signals reconstructed from said test signals; and, an on-chip programmable signal analyzer circuit for continuously detecting said recovered test signals within said predetermined window of time, whereby operation of said transceiver device is verified.

2. The system according to claim 1, wherein said on-chip programmable signal generator provides data patterns at a predetermined frequency and duty cycle.

3. The system according to claim 1, wherein said receiver comprises phase-lock-loop circuit for locking onto a signals generated by said analog transmitter and generating a lock indicator signal when a received signal is locked, said on-chip programmable signal analyzer circuit detecting said recovered test signals upon detection of said lock indicator signal.

4. The system according to claim 1, wherein said on-chip programmable signal analyzer circuit includes counter device for determining a number of edge transitions of said recovered signals for subsequent verification of reconstructed data patterns.

5. The system according to claim 1, wherein said analog transmitter comprises at least one functional transmitter and at least one test-specific transmitter for generating said test signals during a test mode.

6. The system according to claim 5, wherein said test-specific transmitter includes means for impairing characteristics of said transmitted test signal.

7. The system according to claim 6, wherein said impairing characteristics includes one of attenuation of said transmitted signal and distortion of said transmitted test signal.

8. A transceiver for receiving and transmitting data over a network comprising:
   a) built in self test device (BIST) device for generating and transmitting data signals representative of signals capable of being transmitted over a network, said BIST further generating a control signal for impairing characteristics of said data signals;
   b) a transmitter device for receiving said data signals and said impair control signal and generating an output signal corresponding to said data signals and having an impaired characteristic according to said impair control signal, said output signal being generated continuously during a predetermined time window;
   c) a receiver device for continuously receiving said output signal from said transmitter device and for reconstructing said data signals within said predetermined time window, said BIST device receiving said reconstructed data signals,
   wherein said BIST device includes means for detecting erroneous performance by said transceiver device from the reconstructed data signals.

9. The transceiver according to claim 8, wherein said BIST device includes means for programming said data signals pertaining to signals to be transmitted for testing said transceiver device.

10. The transceiver according to claim 8, wherein said control signal for impairing characteristics of said data signals includes signals for impairing phase and amplitude of said data signals.

11. The transceiver according to claim 8, wherein said data signals include an embedded reference clock signal, said BIST device further comprising means for locking onto said reference clock signal.

12. The transceiver according to claim 8, wherein said transmitter and said receiver are provided on a single integrated circuit, said transceiver device further comprising transfer gate for selectively coupling said output signal from said transmitter to said receiver device within said integrated circuit.

13. The transceiver according to claim 11, wherein said means for detecting erroneous performance by said transceiver from the reconstructed signals data comprises a counter device for counting edge transitions of said reference clock signal for establishing a test time window for reconstructing said signals data recovered from said output signal.

14. The transceiver according to claim 13, wherein said means for detecting erroneous performance by said transceiver from the reconstructed signals data comprises a counter device for counting edge transitions of said signals data within said established test time window.

15. A method for testing performance of a transceiver device for receiving and transmitting data over a network, said method comprising:
   a) generating and transmitting data signals representative of signals capable of being transmitted over a network, and generating a control signal for impairing characteristics of said data signals;
   b) a transmitter component of said transceiver device receiving said data signals and said impair control signal and generating an output signal corresponding to data signals and having an impaired characteristic according to said impair control signal, said output signal being generated continuously during a predetermined time window;
   c) a receive component of said transceiver device continuously receiving said output signal from said transmitter component and for reconstructing said signals data within said predetermined time window; and,
   d) detecting erroneous performance by said transceiver from the reconstructed signals data.

16. A program storage device readable by a machine, tangibly embodying a program of instructions executable by the machine to perform method steps for testing a transceiver device, said method comprising the steps of:
   generating a number of data signals representative of data capable of being transmitted over a network by a transceiver device;
   generating a control signal for impairing characteristics of said data signals,
   enabling an analog transmitter component of said transceiver device to receive said data signals and said impair control signal and generating an output signal corresponding to said data signals and having an impaired characteristic according to said impair control signal, said output signal being generated continuously during a predetermined time window;
   enabling a receiver component of said transceiver device to continuously receive said output signal from said transmitter component;
   reconstructing said signals data included in said output signal within said predetermined time window; and,
   detecting erroneous performance by said transceiver device from the reconstructed signals data.

17. A program storage device readable by a machine according to claim 16, wherein the step of generating said data signals includes applying a reference clock signal to data generating components for a predetermined test time window.

18. A program storage device readable by a machine according to claim 17, wherein the step of reconstructing said signals data includes counting number of edge transitions of data bits within said predetermined test time window and storing a final value representing the recovered data.

19. A program storage device readable by a machine according to claim 17, wherein the step of reconstructing said signals data includes counting number of edge transitions of said reference clock to establish said test time window.

20. A program storage device readable by a machine according to claim 19, wherein said detecting step further includes the steps of:
   scanning out said values of said recovered data received during said test time window; and,
   comparing scanned out recovered data with predetermined expected values for said signals data.

21. A program storage device readable by a machine according to claim 19, further including the steps of:
   storing an expected result for said recovered data in a register prior to testing; and
   comparing recovered data with said expected result on-chip.

\* \* \* \* \*